United States Patent [19]

Jenq et al.

[11] Patent Number: 5,893,751

[45] Date of Patent: Apr. 13, 1999

[54] SELF-ALIGNED SILICIDE MANUFACTURING METHOD

[75] Inventors: Jason Jenq, Pingtung; Tung-Po Chen, Taichung, both of Taiwan

[73] Assignee: United Microelectronics Corporation, Taiwan

[21] Appl. No.: 08/736,939

[22] Filed: Oct. 25, 1996

[30] Foreign Application Priority Data

Aug. 9, 1996 [TW] Taiwan ................................ 85109703

[51] Int. Cl.$^6$ ................................................. H01L 21/44

[52] U.S. Cl. ....................... 438/655; 438/656; 438/657; 438/664

[58] Field of Search ............................... 458/586, 592, 458/655, 656, 657, 659, 664, 945

[56] References Cited

U.S. PATENT DOCUMENTS

| 4,983,544 | 1/1991 | Lu et al. . | |
|---|---|---|---|
| 5,554,566 | 9/1996 | Lur et al. | 437/193 |
| 5,571,735 | 11/1996 | Mogami et al. | 437/41 |
| 5,593,923 | 1/1997 | Horiuchi et al. | 437/200 |

FOREIGN PATENT DOCUMENTS

| 0 264 692 A2 | 4/1988 | European Pat. Off. . |
| 0325328 | 7/1989 | European Pat. Off. . |
| 2-297939 | 10/1990 | Japan . |
| 5-036632 | 2/1993 | Japan . |
| 6-112158 | 4/1994 | Japan . |
| 2214708 | 6/1989 | United Kingdom . |

OTHER PUBLICATIONS

S. Wolf, "Silicon Processing for the VLSI Era, vol. 2", Lattice Press, pp. 147–149, 1990.

Primary Examiner—John F. Niebling
Assistant Examiner—Ha Tran Nguyen
Attorney, Agent, or Firm—Rabin & Champagne, P.C.

[57] ABSTRACT

An improved self-aligned silicide manufacturing method in which prior to the formation of a heat resistant metallic layer on top of a silicon substrate, a treatment of exposed surfaces of a gate terminal and source/drain diffusion regions is performed to increase surface roughness enabling an increase in crystallization nucleus number, as well as lowering crystallization temperature.

14 Claims, 3 Drawing Sheets

SELF-ALIGNED SILICIDE MANUFACTURING METHOD

BACKGROUND OF THE INVENTION

1. Field of the Invention

This invention relates in general to a semiconductor manufacturing method, and more particularly to a self-aligned silicide (salicide) manufacturing method.

2. Description of the Related Art

In accordance with the increase in the level of semiconductor component integration, designed dimensions of components gradually become smaller and smaller, which raises the resistance of the source and drain terminals of a MOS component to a level comparable to the MOS channel. To adjust the sheet resistance of both the drain and the source, as well as to keep a shallow contact surface between the metal and MOS layer intact, a so-called self-aligned silicide (salicide) manufacturing process is employed, and has gradually become a part of the VLSI manufacturing process at line widths of 0.5 μm or below.

Titanium is one of the most commonly used heat resistant metallic materials for using in salicide processing (others include metals such as platinum and cobalt). The conventional manufacturing process includes forming a thin titanium layer above the gate defined silicon chip by a sputtering method, and using a high temperature to make the titanium react with polysilicon layers above the gate and source/drain terminals, thus forming titanium silicide. After the unreacted titanium is removed by a wet etching method, a thin titanium silicide layer on each of the three MOS terminals (gate, source, drain) is left behind. Because the self-aligned silicide manufacturing process can form a low resistance metallic silicide (such as titanium silicide) on the surface of silicon and polysilicon, which is formed without photolithographic processing, the manufacturing process is rather simple, except that the operating conditions for rapid thermal annealing in the silicide processing need to be monitored carefully.

A conventional self-aligned silicide manufacturing method is now described as an example illustrating the manufacturing process. Referring to FIG. 1A, a semiconductor silicon substrate 10 is provided, and a field oxide layer 12, a transistor with a gate made from an oxide layer 14 and a polysilicon gate terminal electrode 16 together with source/drain diffusion regions 20 are formed on the substrate 10. Sidewall spacers 18 are also formed on two sidewalls of the gate.

Then, referring to FIG. 1B, a heat resistant metallic layer 22 (for example, titanium, cobalt or platinum) is formed above the substrate 10 by a DC sputtering method. For this example and in this illustration, a titanium layer 22 is formed.

Finally, referring to FIG. 1C, at a high temperature and using rapid thermal processing, titanium in contact with the gate and source/drain diffusion regions reacts to form thin titanium silicide layers 24 and 26 on the surface of the gate and the source/drain terminals. In other areas, the titanium layer 22 remains unreacted and is removed by a subsequent wet etching method.

For component dimensions having a line width of less than 0.4 μm, using self-aligned titanium silicide has become a necessary part in the processing because the lower sheet resistance and contact resistance provided by the process is very important for achieving high speed/low energy components.

In conventional processing methods, plating a thicker layer of metallic titanium usually can form a better titanium silicide layer accompanied by a better sheet resistance and contact resistance, however the resulting junction depth is shallower which can disadvantageously result in a higher leakage current. Moreover, the high temperature needed in the silicide formation step is difficult to control. Although rapid thermal processing (RTP) techniques have been widely applied in this processing step, the relative newness of RTP, along with other processing factors makes the yield from self-aligned silicide processing still much lower than in conventional processing.

SUMMARY OF THE INVENTION

It is therefore an object of this invention to provide an improved self-aligned silicide manufacturing method in which, prior to the formation of the heat resistant metallic layer on top of the silicon substrate, a treatment of the exposed surfaces of the gate terminal and source/drain diffusion regions is performed, to increase the surface roughness thereby enabling an increase in the crystallization nucleus number, as well as lowering the crystallization temperature. Such a treatment can lower not only the sheet resistance and contact resistance, but also reduce leakage current as well. The processing in an exemplary embodiment includes the following steps:

(a) forming a transistor which includes a gate terminal having two sidewalls, and source/drain diffusion regions, on a silicon substrate, and forming sidewall spacers on the two sidewalls of the gate terminal;

(b) performing a surface treatment of exposed surfaces of the gate terminal and the source/drain diffusion regions thereby increasing surface roughness and increasing the crystallization nucleus number as well as lowering crystallization temperature;

(c) forming a heat resistant metallic layer above the silicon substrate;

(d) performing a first rapid thermal annealing letting the heat resistant metallic layer, which is in contact with the gate terminal and the source/drain diffusion regions, react to form a heat resistant metallic silicide layer, the heat resistant metallic layer in contact with the sidewall spacers remaining unreacted;

(e) removing the unreacted heat resistant metallic layer; and (f) performing a second rapid thermal annealing letting the heat resistant metallic silicide layer recrystallize, thereby lowering sheet resistance and contact resistance.

BRIEF DESCRIPTION OF THE DRAWINGS

Other objects, features, and advantages of the invention will become apparent from the following detailed description of the exemplary preferred but non-limiting embodiment. The description is made with reference to the accompanying drawings in which.

DETAILED DESCRIPTION OF THE PREFERRED EMBODIMENT

Figure 1A:
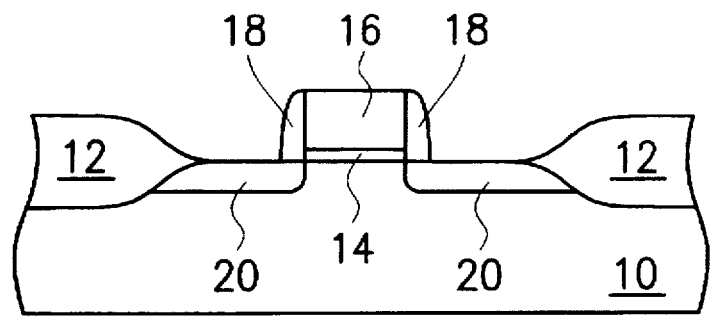
FIGS. 1A to 1C are cross-sectional views showing the manufacturing process in a conventional self-aligned silicide processing.
Figure 1B:
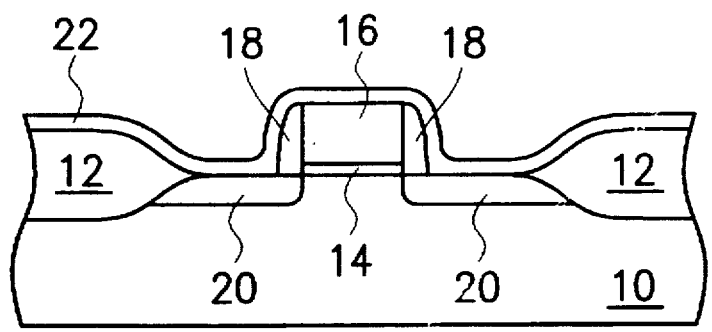
Figure 1C:
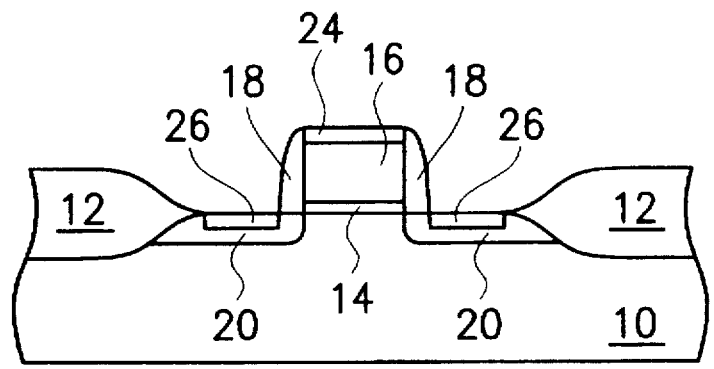
Figure 2A:
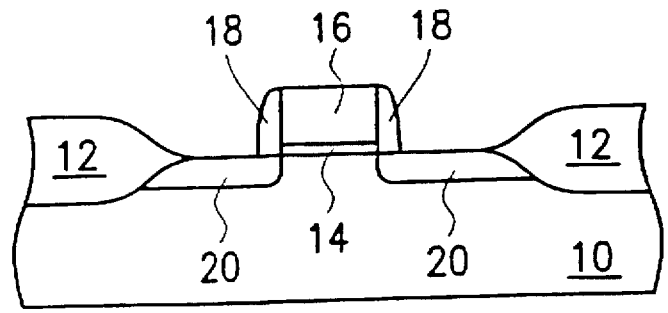
FIGS. 2A to 2E are cross-sectional views showing the manufacturing process in a self-aligned silicide processing according to an exemplary embodiment of this invention.

First, referring to FIG. 2A, a semiconductor component, such as that shown in FIG. 1A, is provided, similar elements being labelled similarly. The semiconductor component includes a field oxide area 12, a transistor with a gate made from an oxide layer 14 and a polysilicon gate electrode terminal 16 together with source/drain diffusion regions 20, formed above semiconductor substrate 10. Sidewall spacers 18 are formed on the two sidewalls of the gate.

Figure 2B:
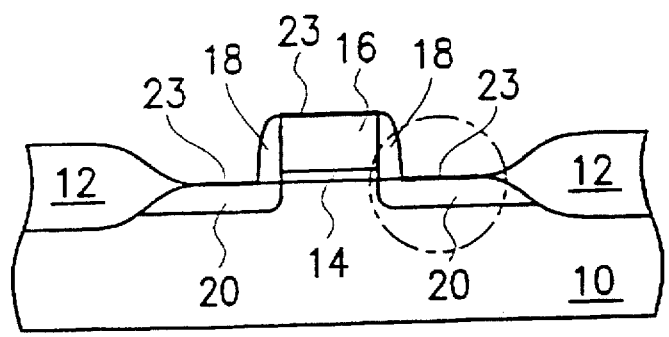
Figure 2E:
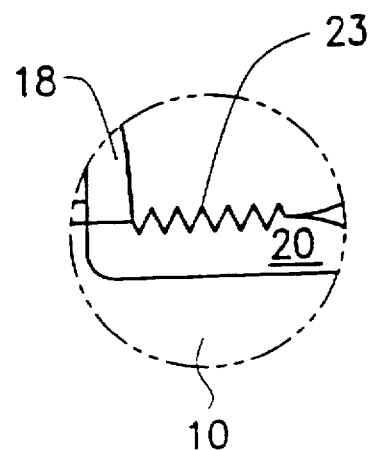

Then, referring to FIGS. 2B and 2E, a surface treatment is performed on the exposed surfaces of the gate terminal and the source/drain diffusion regions to form rough surfaces 23 as shown in the enlarged area to increase the crystallization nucleus number and to lower the crystallization temperature. Argon plasma or wet etching methods, for example, can be used in the surface treatment process, once or twice consecutively to increase the roughness in the polysilicon surfaces. The argon plasma reaction can be conducted, for example, under an argon gas flow rate of 60 sccm and a pressure of about 100 mTorr, with the electrode plate power supply set to about 800 W; and the etchant solution used in the wet etching method is, for example, MSDS-PME, which is manufactured by an American company, and comprises $NH_4F/NH_4H_2PO_4/H_2O$.

Figure 2C:
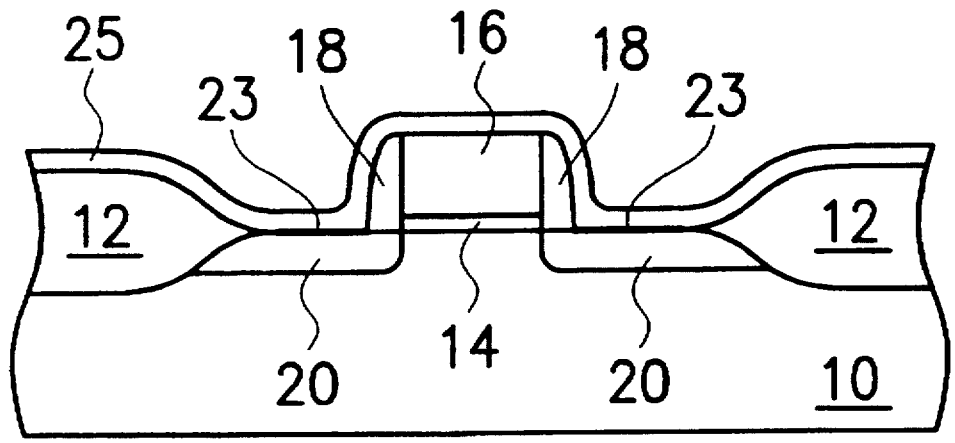

Next, referring to FIG. 2C, a heat resistant metallic layer, for example, platinum, cobalt or titanium, is deposited above the silicon substrate by a DC sputtering method, and in this exemplary preferred embodiment, a layer of titanium 25 with a thickness between about 400–500 Å is deposited. Then a first rapid thermal annealing is performed to let the gate terminal and the source/drain diffusion regions in contact with the titanium layer react to form titanium silicide. Annealing is, for example, first conducted in a nitrogen atmosphere at a temperature of about 650° C. for about 30 seconds, and then the temperature is set to about 750° C. to perform another annealing for 30 seconds.

Figure 2D:
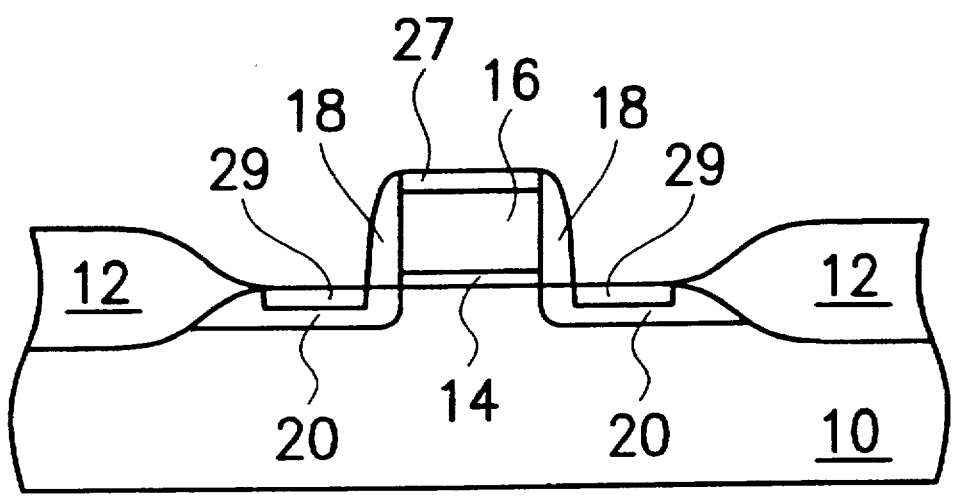

Finally, referring to FIG. 2D, after the first annealing, titanium silicide layers 27 and 29 are formed in the gate terminal and source/drain diffusion regions, and the unreacted metallic titanium layer elsewhere is removed by a selective wet etching method. In selective wet etching, ammonia water/hydrogen peroxide/DI water, having a volumetric ration of 1:1:5, for example, at a temperature of about 75° C., is first used for 5 minutes to remove the unreactive metallic titanium layer, and then a sulfuric acid/water solution, having a volumetric ratio of 1:4, for example, is used to remove the residual metallic titanium layer. Thereafter, a second rapid thermal annealing is performed to let the titanium silicide layer recrystallize (phase transformation) to lower its sheet resistance and contact resistance. The second annealing is conducted, for example, under a nitrogen atmosphere with a temperature of about 825° C., and is continuous for 20 seconds.

A low sheet resistance and low contact resistance self-aligned titanium silicide layer manufactured according to this invention is thus formed. It overcomes the defect of a high leakage current in the conventional manufacturing method, and is suitable for component designs having small dimensions and/or a high speed/low power characteristic.

While the invention has been described by way of example and terms of an exemplary preferred embodiment, it is to be understood that the invention not be limited thereto. On the contrary, it is intended that the invention covers various modifications and similar arrangements included within the scope of the appended claims, which should be accorded the broadest interpretation so as to encompass all such modifications and similar arrangements.

What is claimed is:

1. An improved self-aligned metallic silicide manufacturing method comprising:

(a) forming a transistor which includes a gate having two sidewalls, and source/drain diffusion regions, on a silicon substrate and forming sidewall spacers on the two sidewalls of the gate;

(b) performing a surface treatment, using a wet etching method with a wet etching solution comprising MSDS-PME, of exposed surfaces of the gate and the source/drain diffusion regions, thereby increasing surface roughness and increasing the crystallization nucleus number as well as lowing crystallization temperature;

(c) forming a heat resistant metallic layer above the silicon substrate;

(d) performing a first rapid thermal annealing letting the heat resistant metallic layer, which is in contact with the gate and the source/drain diffusion regions, react to form a heat resistant metallic silicide layer, the heat resistant metallic layer in contact with the sidewall spacer remaining unreacted;

(e) removing the unreacted heat resistant metallic layer; and (f) performing a second rapid thermal annealing letting the heat resistant metallic silicide layer recrystallize, thereby lowering sheet resistance and contact resistance.

2. A method according to claim 1, wherein the material for the heat resistant metallic layer comprises titanium.

3. A method according to claim 2, wherein the thickness of the metallic titanium layer is formed a range of about 400–500 Å.

4. A method according to claim 1, wherein the heat resistant metallic silicide comprises titanium silicide.

5. A method according to claim 1, wherein the first rapid thermal annealing step (d) comprises annealing in a nitrogen thermal atmosphere at a temperature of about 650° C. for 30 seconds and subsequently annealing at a temperature of about 750° C. for 30 seconds.

6. A method according to claim 1, wherein the second rapid thermal annealing step (f) comprises continuous annealing in a nitrogen atmosphere at a temperature of about 825° C. for 30 seconds.

7. A method according to claim 1, wherein step (e) comprises etching the unreacted heat resistant metallic layer with a solution of ammonia water/hydrogen peroxide/water having a volumetric ratio of 1:1:5 at a temperature of about 75° C., and subsequently etching the heat resistant metallic layer remaining with a solution of sulphuric acid/water having volumetric ratio of 1:4.

8. An improved self-aligned metallic silicide manufacturing method comprising:

(a) forming a transistor which includes a sate having two sidewalls, and source/drain diffusion regions, on a silicon substrate and forming sidewall spacers on the two sidewalls of the gate;

(b) performing a surface treatment, of exposed surfaces of the gate and the source/drain diffusion regions, thereby increasing surface roughness and increasing the crystallization nucleus number as well as lowing crystallization temperature; by performing an argon plasma and wet etching method twice;

wherein the reaction conditions using argon plasma comprise an argon gas flow rate of about 60 sscm, a pressure of about 100 m Torr, and an electrode plate power of about 800 W; and wherein the etching solution for the wet etching method comprises a solution of MSDS-PME;

(c) forming a heat resistant metallic layer above the silicon substrate;

(d) performing a first rapid thermal annealing letting the heat resistant metallic layer, which is in contact with the gate and the source/drain diffusion regions, react to form a heat resistant metallic silicide layer, the heat resistant metallic layer in contact with the sidewall spacer remaining unreacted;

(e) removing the unreacted heat resistant metallic layer; and (f) performing a second rapid thermal annealing letting the heat resistant metallic silicide layer recrystallize, thereby lowering sheet resistance and contact resistance.

9. A method according to claim 8, wherein the material for the heat resistant metallic layer comprises titanium.

10. A method according to claim 8, wherein the heat resistant metallic silicide comprises titanium silicide.

11. A method according to claim 8, wherein the first rapid thermal annealing step (d) comprises annealing in a nitrogen atmosphere at a temperature of about 650° C. for 30 seconds and subsequently annealing at a temperature of about 750° for 30 seconds.

12. A method according to claim 8, wherein the second rapid thermal annealing step (f) comprises continuous annealing in a nitrogen atmosphere at a temperature of about 825° C. for 30 seconds.

13. A method according to claim 8, wherein step (e) comprises etching the unreacted heat resistant metallic layer with a solution of ammonia water/hydrogen peroxide/water having a volumetric ratio of 1:1:5 at a temperature of about 75° C., and subsequently etching the heat resistant metallic layer remaining with a solution of sulphuric acid/water having volumetric ratio of 1:4.

14. A method according to claim 13, wherein the thickness of the metallic titanium layer is formed in a range of about 400–500 Å.

* * * * *